(12) United States Patent
Nakayama

(10) Patent No.: US 7,328,040 B2
(45) Date of Patent: Feb. 5, 2008

(54) MOBILE-COMMUNICATION EQUIPMENT AND TRANSMISSION POWER CONTROL METHOD

(75) Inventor: Masahiko Nakayama, Tokyo (JP)

(73) Assignee: NEC Corporation (JP)

( * ) Notice: Subject to any disclaimer, the term of this patent is extended or adjusted under 35 U.S.C. 154(b) by 515 days.

(21) Appl. No.: 11/060,170

(22) Filed: Feb. 17, 2005

(65) Prior Publication Data

US 2005/0186922 A1    Aug. 25, 2005

(30) Foreign Application Priority Data

Feb. 20, 2004    (JP) .............................. 2004-044551

(51) Int. Cl.
*H04B 7/00* (2006.01)
*H04B 1/04* (2006.01)

(52) U.S. Cl. .................... 455/522; 455/127.1; 455/517

(58) Field of Classification Search ................ 455/522, 455/556.1, 556.2, 127.1, 127.2, 115.1, 91, 455/517; 370/318, 311, 335, 342, 317; 330/85, 330/127, 129
See application file for complete search history.

(56) References Cited

U.S. PATENT DOCUMENTS

| 4,331,928 | A | * | 5/1982 | Heidt .......................... 330/149 |
| 5,054,116 | A | | 10/1991 | Davidson |
| 5,507,017 | A | * | 4/1996 | Whitmarsh et al. ......... 455/126 |
| 5,628,059 | A | * | 5/1997 | Kurisu ........................ 455/126 |
| 5,977,824 | A | * | 11/1999 | Sparks ........................... 330/2 |
| 5,994,965 | A | | 11/1999 | Davis et al. |
| 6,173,163 | B1 | | 1/2001 | Northcutt |
| 6,304,749 | B1 | | 10/2001 | Obara |
| 6,324,230 | B1 | | 11/2001 | Graham et al. |

(Continued)

FOREIGN PATENT DOCUMENTS

GB    2 265 270 A    9/1993

(Continued)

OTHER PUBLICATIONS

Search Report issued by European Patent Office in connection with corresponding application No. 05026768.1-2215 on Feb. 15, 2006.

(Continued)

*Primary Examiner*—Sonny Trinh
(74) *Attorney, Agent, or Firm*—Ostrolenk, Faber, Gerb & Soffen, LLP

(57) ABSTRACT

Mobile communication equipment comprises a power amplifier for amplifying a transmission signal and a feedback circuit for providing feedback to allow the above-described power amplifier to output a transmission-power set value. The feedback circuit comprises an error detection unit for detecting an error between a power value obtained by detecting a portion of the power of the transmission signal amplified by the power amplifier and the transmission-power set value specified by the above-described transmission-power specifying unit, a Loop-gain generating unit for periodically switching two different loop-gain values at a predetermined time ratio to output one of them, a loop-gain multiplying unit for multiplying the error detected by the error-detection unit by the loop-gain value outputted from the loop-gain generating unit to output an error value that results from the multiplication, and a feedback-amount generating unit for integrating the error value outputted from the loop-gain multiplying unit to generate a specific amount of the feedback.

10 Claims, 5 Drawing Sheets

U.S. PATENT DOCUMENTS

| | | | |
|---|---|---|---|
| 6,381,286 B1 * | 4/2002 | Wilkinson et al. | 375/296 |
| 6,670,849 B1 * | 12/2003 | Damgaard et al. | 330/129 |
| 6,819,938 B2 * | 11/2004 | Sahota | 455/522 |
| 6,970,684 B2 * | 11/2005 | Haapakoski | 455/115.1 |
| 7,133,649 B2 * | 11/2006 | Kanazawa et al. | 455/91 |
| 7,148,749 B2 * | 12/2006 | Rahman et al. | 330/279 |
| 2003/0073419 A1 * | 4/2003 | Chadwick | 455/126 |

FOREIGN PATENT DOCUMENTS

| | | |
|---|---|---|
| JP | 07-307631 | 11/1995 |
| JP | 10-41767 | 2/1998 |
| JP | 11-017561 | 1/1999 |
| JP | 11-308126 | 11/1999 |
| JP | 2000-036790 | 2/2000 |

OTHER PUBLICATIONS

Search Report issued by European Patent Office in connection with corresponding application No. 05003202.8-2215 PCT on Jul. 28, 2005.

English translation of Abstract for Japanese Patent Publication No. 10041767 dated Feb. 13, 1998 for application No. 08198013 dated Jul. 26, 1996.

Search Report issued by European Patent Office in connection with corresponding application No. 05003202 on Mar. 20, 2005.

* cited by examiner

MOBILE-COMMUNICATION EQUIPMENT AND TRANSMISSION POWER CONTROL METHOD

BACKGROUND OF THE INVENTION

1. Field of the Invention

The present invention relates to a mobile station of a mobile-communication system, for example, mobile-communication equipment such as a cellular telephone and a personal digital assistance (PDA), and to a transmission-power control method thereof.

2. Description of the Related Art

One multiple-access method adopted in the mobile-communication system is CDMA (Code Division Multiple Access) method. The CDMA method transmits information between a plurality of mobile stations and base stations, using the same frequency. This case may cause a so-called near-far problem in that, if each mobile station transmits a radio wave at the same transmission power, the radio wave from a mobile station that is further from the base station has less power that is received at the base station than a radio wave from a mobile station that is nearer the base station, so that the radio wave from the mobile station further from the base station is strongly affected by other radio waves, thereby degrading communication quality. To resolve this near-far problem, each mobile station accurately controls the transmission power to ensure that the constant power arrives at the base station. This transmission-power control can reduce the interference between the communication channels of each mobile-station to increase the frequency-utilization efficiency.

The recent wideband CDMA (W-CDMA) method defines a maximum permissible value and accuracy of the transmission power. More specifically, the transmission-power control in the W-CDMA method requires a wide range of transmission-power control that uses "1 dB step" control (which means one control-step-width being 1 dB). A transmission-power control technique is thus needed that can provide a higher maximum-permissible value and a higher accuracy of the transmission power.

The transmission-power control may generally have a reduced absolute-accuracy when power is transmitted at higher output conditions due to the poor linearity of input/output characteristics (the characteristics of input power vs. output power) of the power amplifier (power amp). Various methods have thus been proposed that can provide a wider range of transmission-power control and a higher accuracy power control. One approach is a transmission-power control method with a feedback system, such as PAC (Automatic Power Control) and ALC (Automatic Level Control) (see Japanese application patent laid-open publications No. Hei 11-308126 and Hei 07-307631). This transmission-power control with the feedback system provides feedback to allow the power amplifier, which amplifies the transmission signal, to output a specified transmission-power set value. For example, the feedback system with digital processes detects and measures the transmission power, and compares the detection results and the transmission-power set value to determine the transmission-power error. The feedback system then multiplies the determined transmission-power error by a predetermined loop-gain value to determine an error value, and integrates the determined error value to calculate a feedback amount. The feedback amount thus calculated is reflected as the transmission-power adjustment.

The following problems arise, however, in the above-mentioned conventional transmission-power control techniques.

In the feedback system with digital processes, a larger loop-gain value can increase each feedback amount, so that the transmission-power value can reach the set value in a shorter time, but the transmission-power value does not converged due to the control delay and the like and consequently, the feedback system may oscillate. On the other hand, a smaller loop-gain value can decrease each feedback amount to prevent the oscillation problem, but the transmission-power value may reach the set value in a longer time. Additional problems may arise in which the transmission-power error may not be appropriately corrected with the feedback amount because of the combined effects of the operation error of the feedback value associated with the digital processes (which is a truncation error due to the rounding and referred to hereafter for simplicity as a rounding error) and the temperature characteristics of PA and detector and the like.

A more detailed description is given below of the problems with the combined effects of the rounding error and the temperature characteristics.

Diode detection is generally used to detect the transmission power. The diode detection measures the transmission-power by detecting the amplitude of the transmission-power waveform, so that the detected voltage values which are results of the measurement are true values (voltages). The transmission-power set value is usually given in "dB", which is a unit of power, so that the feedback system includes circuitry based on "dB". In such a circuit, a conversion table is used for converting the detected voltage value to the power value (dB). The conversion table is usually created based on the correlation between the actually-detected voltage value and the transmission-power value. Such a correlation is acquired based on the results that are obtained by measuring the diode characteristics under the condition in which there is no temperature-change effect, for example, the condition in which the temperature of the radio transmitter is stable.

The feedback system using the conversion table as mentioned above is affected by temperature characteristics, particularly of the PA affect. Upon start of transmission, a large amount of current starts to flow through PA, which then heats up and its temperature increases. The temperature increase of PA is the largest shortly after the start of transmission, and then decreases with time to reach a constant PA temperature. The conversion table is created based on the condition in which the PA temperature is constant.

PA has semiconductor characteristics that provide higher outputs at lower operation temperatures, and lower outputs at higher operation temperatures. After the transmission starts, therefore, the transmission-power value which is outputted by PA gradually decreases as the PA operation-temperature is increased. For PA to provide a constant output, it is necessary to increase an input of PA as the operation temperature increases. Conventional transmission-power control techniques, however, do not increase the PA input with the temperature increases. During the period from the start of the transmission until the PA temperature is stable, therefore, the power value that is converted based on the above-mentioned conversion table includes an error due to the PA temperature characteristics, and the combination of this error and the rounding error may mistakenly make the error value (feedback amount) zero. Once the error value becomes zero, the feedback system subsequently does not accumulate the feedback amount or does not reflect the error, thereby providing an incorrect feedback control which may send the transmission signal at the incorrect transmission power.

Japanese application patent laid-open publication No. Hei 11-308126 has proposed a feedback system which holds a plurality of loop gains and switches between a high-speed mode for a shorter convergence time and a high-accuracy mode for higher accuracy control. In this case, the static modes are switched in the feedback system, so that PA temperature characteristics and the like are not taken into account and a problem may arise due to the combined effects of the rounding error and the temperature characteristics as mentioned above.

As a conversion table (true value (voltage) to power), a plurality of tables may be provided based on the characteristics of each temperature range. More specifically, conversion tables may be created at four stages of −25° C. to 0° C., 0° C. to 25° C., 25° C. to 50° C., and 50° C. or more, and the tables may be switched for each measurement temperature. This case, however, may require a larger-scale circuit for the increased number of tables. An additional problem may arise in which the discontinuity of the transmission-power value, when conversion tables are switched, may make the control more difficult.

SUMMARY OF THE INVENTION

An object of the present invention is to provide mobile-communication equipment and a transmission-power control method, which can solve the above-mentioned problems and can provide a power control at high accuracy and a reduced convergence time with a simple circuit configuration.

To achieve the above-described object, the first mobile-communication equipment according to the present invention comprises a power amplifier for amplifying a transmission signal and a feedback circuit for providing feedback to allow the power amplifier to output a specified transmission-power set value. The feedback circuit comprises a transmission-power specifying unit for specifying the transmission-power set value, an error-detection unit for detecting an error between a power value obtained by detecting a portion of the power of the transmission signal amplified by the power amplifier and the transmission-power set value specified by the transmission-power specifying unit, a loop-gain generating unit for periodically switching two different loop-gain values at a predetermined time ratio to output one of them, a loop-gain multiplying unit for multiplying the error detected by the error-detection unit by the loop-gain value outputted from the loop-gain generating unit to output an error value that results from the multiplication, and a feedback-amount generating unit for integrating the error value outputted from the loop-gain multiplying unit to generate the feedback amount.

The first mobile-communication equipment as mentioned above periodically switches two large and small loop-gain values such as "0.2" and "1.0" at a time ratio of, for example, 4:1 and outputs one of them. During the period in which "1.0" is selected, a larger feedback amount is provided so that the transmission power can reach the transmission-power set value in a shorter time.

As described above, the oscillation may occur in a feedback system that continuously has a large loop-gain value such as "1.0". According to the above mentioned configuration, since the loop-gain generating unit periodically switches the loop-gain value from "1.0" to "0.2", it can provide a configuration that causes the oscillation to be difficult.

Further, as described above, when the feedback system continuously has a small loop-gain value such as "0.2", the PA temperature characteristics may change the correlation between the detected-voltage value and the power value (conversion value) in the conversion table. Consequently, a rounding error cannot be distinguished from an error due to the temperature characteristics of the power amplifier, and the error value (feedback amount) may mistakenly be zero. With the above mentioned configuration, since the loop-gain generating unit periodically switches the loop-gain value from "0.2" to "1.0", it can prevent the rounding error from being negligible. The error value (feedback amount) is thus not made zero by mistake, making it possible for the transmission power to reach the transmission-power set value at high accuracy.

The advantages mentioned above which are obtained through the cyclic switching of the loop-gain values allow for high-speed and highly-accurate transmission-power control.

This embodiment also eliminates the adjustment table for the temperature changes, thereby making unnecessary a large scale circuit or complex configuration.

The second mobile-communication equipment according to the present invention comprises a power amplifier for amplifying a transmission signal, and a feedback circuit for providing feedback to allow the power amplifier to output a specified transmission-power set value. The feedback circuit comprises a transmission-power specifying unit for specifying the transmission-power set value, an error-detection unit for detecting an error between a power value obtained by detecting a portion of the power of the transmission signal amplified by the power amplifier and the transmission-power set value specified by the transmission-power specifying unit, a temperature measuring unit for measuring a temperature of a predetermined portion and outputting a timing signal upon detection of a certain amount of temperature change, a loop-gain generating unit for holding a first loop-gain value and a second loop-gain value that is larger than the first loop-gain value, and upon receipt of the timing signal provided from the temperature measuring unit, outputting the second loop-gain value for a predetermined period, and outputting the first loop-gain value except for the above-described predetermined period, a loop-gain multiplying unit for multiplying the error detected by the error-detection unit by the loop-gain value outputted from the loop-gain generating unit, and outputting an error value that results from the multiplication, and a feedback-amount generating unit for integrating the error value outputted from the loop-gain multiplying unit to generate an specific amount the feedback.

The second mobile-communication equipment as described above also switches the loop-gain values and has the same operation as in the above-mentioned first mobile-communication equipment.

The third mobile-communication equipment according to the present invention comprises a power amplifier for amplifying a transmission signal and a feedback circuit for providing feedback to allow the power amplifier to output a specified transmission-power set value. The feedback circuit comprises a transmission-power specifying unit for specifying the transmission-power set value, an error-detection unit for detecting an error between a power value obtained by detecting a portion of the power of the transmission signal amplified by the power amplifier and the transmission-power set value specified by the transmission-power specifying unit, a temperature measuring unit for measuring the temperature of a predetermined portion and outputting a timing signal upon detection of a certain amount of temperature change, a loop-gain generating unit for holding a first loop-gain value and a second loop-gain value that is larger than the first loop-gain value, and upon receipt of the timing signal provided from the temperature measuring unit, outputting the second loop-gain value for a predetermined period, and switching periodically the first and second loop-gain values at a predetermined time ratio to output one of them except for the predetermined period, a loop-gain multiplying unit for multiplying the error detected by the error-detection unit by the loop-gain value outputted from the loop-gain generating unit, and outputting an error value that results from the multiplication, and a feedback-amount generating unit for integrating the error value outputted from the loop-gain multiplying unit to generate a specific amount of the feedback.

The third mobile-communication equipment as described above also switches the loop-gain values and has the same operation as in the above-mentioned first mobile-communication equipment.

The first transmission-power control method according to the present invention provides feedback to allow a power amplifier to amplify a transmission signal in order to output a specified transmission-power set value, comprising: a first step of detecting a portion of the power of the transmission signal amplified by the power amplifier to obtain a power value; a second step of detecting an error between a power value obtained in the first step and the specified transmission-power set value; a third step of periodically switching two different loop-gain values at a predetermined time ratio to output one of them; and a fourth step of multiplying the error detected in the second step by the loop-gain value outputted in the third step, and integrating an error value that results from the multiplication to generate an specific amount of the feedback.

The first transmission-power control method as described above also switches the loop-gain values and has the same operation as in the above-mentioned first mobile-communication equipment.

The second transmission-power control method according to the present invention provides feedback to allow a power amplifier to amplify a transmission signal in order to output a specified transmission-power set value, comprising: a first step of detecting a portion of the power of the transmission signal amplified by the power amplifier to obtain a power value; a second step of detecting an error between a power value obtained in the first step and the specified transmission-power set value; a third step of measuring the temperature of a predetermined portion and detecting a certain amount of temperature change; a fourth step of holding a first loop-gain value and a second loop-gain value that is larger than the first loop-gain value, and upon detection of a certain amount of temperature change in the third step, outputting the second loop-gain value for a predetermined period, and outputting the first loop-gain value except for the predetermined period; and a fifth step of multiplying the error detected in the second step by the loop-gain value outputted in the fourth step, and integrating an error value that results from the multiplication to generate a specific amount of the feedback.

The second transmission-power control method as described above also switches the loop-gain values and has the same operation as in the above-mentioned first mobile-communication equipment.

The third transmission-power control method according to the present invention provides feedback to allow a power amplifier to amplify a transmission signal in order to output a specified transmission-power set value, comprising: a first step of detecting a portion of the power of the transmission signal amplified by the power amplifier to obtain a power value; a second step of detecting an error between a power value obtained in the first step and the specified transmission-power set value; a third step of measuring the temperature of a predetermined portion and detecting a certain amount of temperature change; a fourth step of holding a first loop-gain value and a second loop-gain value that is larger than the first loop-gain value, and upon detection of the certain amount of temperature change in the third step, outputting the second loop-gain value for a predetermined period, and periodically switching the first and second loop-gain values at a predetermined time ratio to output one of them except for the predetermined period; a fifth step of multiplying the error detected in the second step by the loop-gain value outputted in the third step, and integrating an error value that results from the multiplication to generate a specific amount of the feedback.

The third transmission-power control method as described above also switches the loop-gain values and has the same operation as in the above-mentioned first mobile-communication equipment.

As describe above, the present invention has the effects of decreasing the convergence time, reducing the effects of errors due to the temperature characteristics, and ensuring the absolute accuracy of the transmission power, compared to conventional transmission-power control techniques.

The present invention also has the effect of providing a structure in which the oscillation phenomena that is due to the control delay in the feedback system is less likely to occur.

The present invention also has the effect that it can be implemented in a simple configuration with only an additional circuit for periodically switching the loop-gain values.

The present invention also has the effect of providing a higher degree of design freedom because there is no need to consider PA temperature characteristics and the like.

The above and other objects, features, and advantages of the present invention will become apparent from the following description with reference to the accompanying drawings which illustrate examples of the present invention.

DESCRIPTION OF THE PREFERRED EMBODIMENTS

Embodiments according to the present invention will now be described in detail with reference to the drawings.

Embodiment 1

Figure 1:
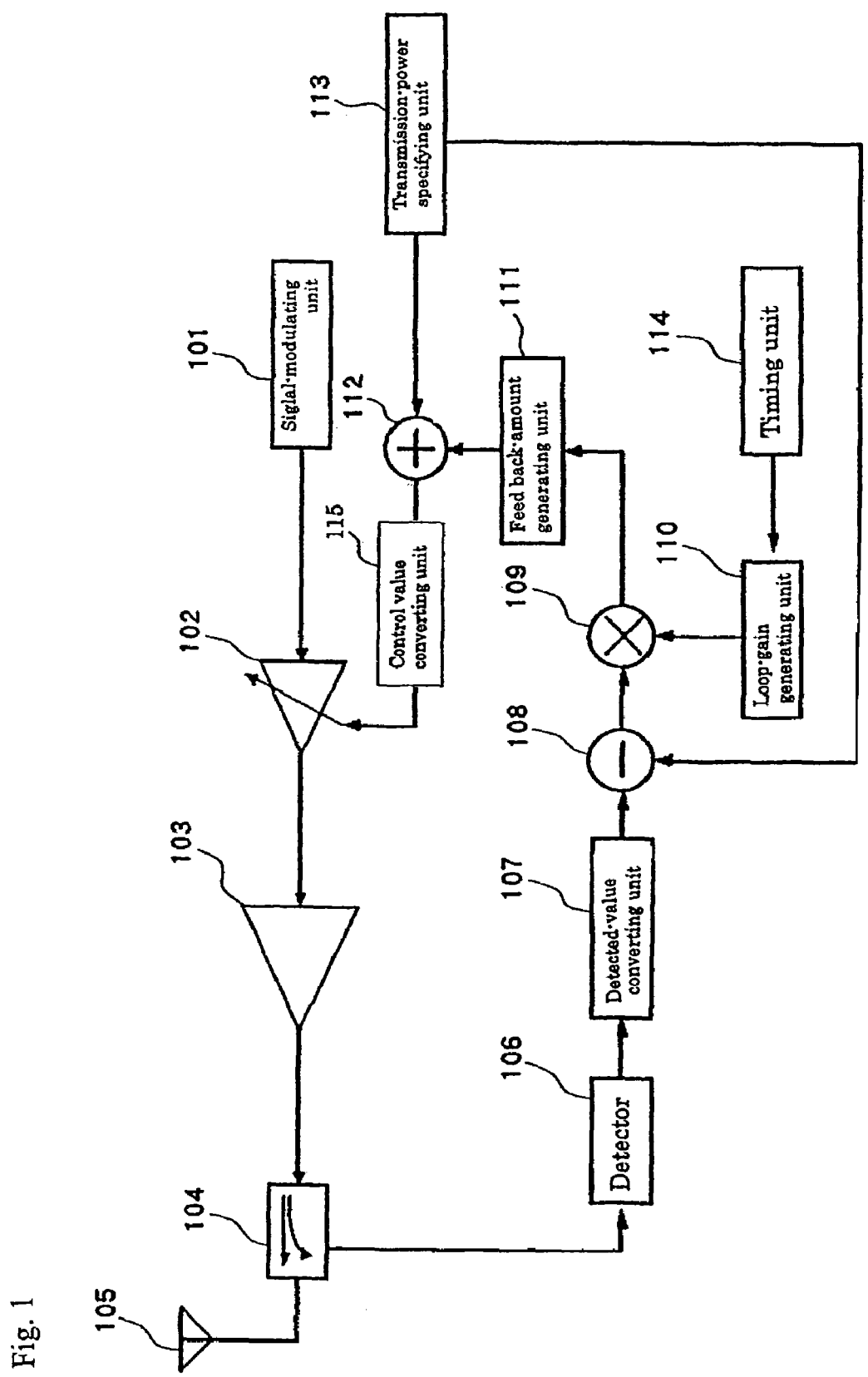
FIG. 1 is a block diagram of a schematic configuration of mobile-communication equipment according to the first embodiment of the present invention.

FIG. 1 is a block diagram of a schematic configuration of mobile-communication equipment according to the first embodiment of the present invention. This mobile-communication equipment can be used as a mobile station (such as a cellular telephone and PDA) of a mobile-communication system using a multiple access method, in particular, the W-CDMA method. Its transmission-power controlling unit includes a basic transmission circuit and a feedback system incorporated therein: the basic transmission circuit includes signal-modulating unit 101, variable gain control amplifier (GCA) 102, directional-branching filter 104, and antenna 105. The feedback system includes power amplifier (AP) 103, detector 106, detected-value converting unit 107, error-detecting unit 108, loop-gain multiplying unit 109, loop-gain generating unit 110, feedback-amount generating unit 111, control-amount adding unit 112, transmission-power specifying unit 113, and timing unit 114.

Signal-modulating unit 101 modulates the data that is to be communicated in a suitable form for radio transmission. The W-CDMA method includes modulation processes such as error-correction coding of the data to be communicated, diffusion modulation, and filtering process. Because these processes are well known and are not features of the present invention, their description is omitted here. After modulating, signal-modulating unit 101 sends the transmission signal through GCA 102, AP 103, and directional-branching filter 104 to antenna 105.

According to the inputted control value, GCA 102 can variably control the transmission-power amplification gain of the transmission signal from signal-modulating unit 101. AP 103 amplifies outputs of GCA 102 (the transmission signal with the transmission-power amplification gain that is controlled). Directional-branching filter 104 has one input and two outputs type and can provide a portion of the supplied transmission-signal power to the feedback system. Antenna 105 can emit radio waves according to the supplied transmission-signal power.

Detector 106, to which one of the outputs (transmission signal) of directional-branching filter 104 is supplied, detects, by diode, the transmission power of the supplied transmission signal in a constant cycle. An output of detector 106 is supplied to one of the inputs of error-detecting unit 108 through detected-value converting unit 107. Detected-value converting unit 107 converts the voltage value detected by detector 106 into the power value.

The transmission-power set value provided from transmission-power specifying unit 113 is supplied to the other input of error-detecting unit 108. Error-detecting unit 108 compares the transmission-power set value from transmission-power specifying unit 113 and the power value converted by detected-value converting unit 107, and provides the transmission-power error based on the comparison to one of the inputs of loop-gain multiplying unit 109.

The loop-gain value from loop-gain generating unit 110 is supplied to the other input of loop-gain multiplying unit 109. Loop-gain multiplying unit 109 multiplies the transmission-power error provided from error-detecting unit 108 by the loop-gain value provided from loop-gain generating unit 110, and provides that the error value that results from the multiplication to feedback-amount generating unit 111. Loop-gain generating unit 110 has at least two different loop-gain values, and switches between these loop-gain values at the timing provided from timing unit 114 to output one of the values. Timing unit 114 generates a cyclic timing that is used as the switching timing of the loop-gain values.

Feedback-amount generating unit 111 integrates the error values provided from loop-gain multiplying unit 109 to operate the feedback amount provided to the transmission-power set value which is the control value of GCA 102. This feedback amount is supplied to one of the input of control-amount adding unit 112. The transmission-power set value from transmission-power specifying unit 113 is supplied to the other input of control-amount adding unit 112. Transmission-power specifying unit 113 specifies the transmission-power set value (dB value) according to the transmission-power control information that is provided from externally. The base station transmits the transmission-power control information to the mobile station in the mobile-communication system. The base station generally transmits the transmission-power control information to each mobile station, such that the base station can receive constant power radio waves from each mobile station. Because the transmission of the transmission-power control information is well-known and is not the feature of the present invention, its description is omitted here. Transmission-power specifying unit 113 provides the specified transmission-power set value to each of control-amount adding and error-detecting units 112 and 108 respectively.

Control-amount adding unit 112 adds to the transmission-power set value that is provided from transmission-power specifying unit 113 the feedback amount provided from feedback-amount generating unit 111, and provides to control value converting unit 115 the power value (dB) that is based on the addition. Control value converting unit 115 converts the power value (dB) provided from control-amount adding unit 112 into a control value (voltage value) and provides it to GCA 102.

Operation of the mobile-communication equipment according to this embodiment will now be described specifically. Because the transmission operation in the transmission circuit from transmission modulating unit 101 to antenna 105 is well-known and is not the feature of the present invention, its description is omitted here.

First, the transmission circuit starts the transmission operation. At the start of the transmission operation, both the feedback system and GCA 102 are in the initial condition (reset condition), so that the transmission signal modulated by signal-modulating unit 101 passes without change through GCA 102 to PA 103 where the signal is amplified. PA 103 provides the amplified transmission signal, through directional-branching filter 104, to antenna 105. Antenna 105 emits the radio wave according to the transmission-signal power provided from directional-branching filter 104. After receiving the radio wave thus emitted, the base station sends the transmission-power control information to the mobile-communication equipment. In the mobile-communication equipment, the receiving unit, not shown in FIG. 1, receives the transmission-power control information from the base station. Upon receipt of the transmission-power control information, transmission-power control is initiated via the feedback system in according to the following procedure.

The receiving unit provides transmission-power control information received from the base station to transmission-power specifying unit 113. Transmission-power specifying unit 113 specifies the transmission power based on the transmission-power control information that has been received. Transmission-power specifying unit 113 specifies, for example, the transmission-power set value such as "24 dBm". The transmission-power set value specified by transmission-power specifying unit 113 is supplied to each of control-amount adding and error-detecting units 102 and 108 respectively.

Directional-branching filter 104 provides a portion of the transmission-signal transmission power which is supplied to antenna 105 to detector 106. Detector 106, by use of a diode, detects the transmission power that is provided from directional-branching filter 104.

Detected-value converting unit 107 converts the output (voltage value) from detector 106 into the power value. For example, detected-value converting unit 107 converts the output (voltage value) of "1.84 V" from detector 106 into a transmission-power value such as "24.93 dBm". Detected-value converting unit 107 usually carries out the conversion by using a predetermined conversion table that gives the correlation between the voltage value and transmission-power value. The relation between the voltage value and transmission-power value mainly depends on the characteristics of the diode used in the detection. The conversion table may thus be preferably created based on the results that are obtained by measuring the diode characteristics of detector 106 under the condition in which there is no temperature-characteristics effect, such as the condition where the temperature of the mobile-communication equipment (more preferably, the temperature of PA 103 serving as a heat source) is stable. The holding unit, not shown in FIG. 1, stores the conversion table, and detected-value converting unit 107 obtains the conversion table from the holding unit. Detected-value converting unit 107 may contain the holding unit.

Detected-value converting unit 107 provides the converted transmission-power value to one of the inputs of error-detecting unit 108. At this stage, the transmission-power set value has been supplied from transmission-power specifying unit 113 to the other input of error-detecting unit 108. Error-detecting unit 108 compares the transmission-power set value from transmission-power specifying unit 113 and the transmission-power value from detected-value converting unit 107, and provides the transmission-power error based on the comparison to loop-gain multiplying unit 109. For example, if the transmission-power value from detected-value converting unit 107 is "24.93 dBm" and the transmission-power set value from transmission-power specifying unit 113 is "24 dBm", then error-detecting unit 108 outputs "−0.93 dB" as the transmission-power error.

Loop-gain multiplying unit 109 multiplies the transmission-power error provided from error-detecting unit 108 by the loop-gain value provided from loop-gain generating unit 110, and provides to feedback-amount generating unit 111 the error value that results from the multiplication. Loop-gain generating unit 110 has, for example, "0.2" as the first loop-gain value, and "1.0" as the second loop-gain value. According to the cyclic timing provided from timing unit 114, loop-gain generating unit 110 switches between the first and second loop-gain values to output one of them. If the first loop-gain value of "0.2" is provided from loop-gain generating unit 110 and the transmission-power error of "−0.93 dB" is provided from error-detecting unit 108, then loop-gain multiplying unit 109 outputs "−0.186 dB" as the error value. If the second loop-gain value of "1.0" is provided from loop-gain generating unit 110, loop-gain multiplying unit 109 directly outputs the transmission-power error of "−0.93 dB" that is provided from error-detecting unit 108.

Feedback-amount generating unit 111 integrates the error value that is provided from loop-gain multiplying unit 109 to produce the feedback amount, and provides the operation results (feedback amount) to control-amount adding unit 112. At this stage, the feedback amount has been supplied from feedback-amount generating unit 111 to one of the inputs of control-amount adding unit 112, and the transmission-power set value has been supplied from transmission-power specifying unit 113 to the other input of control-amount adding unit 112.

Control-amount adding unit 112 adds to the transmission-power set value provided from transmission-power specifying unit 113 the feedback amount provided from feedback-amount generating unit 111, and provides to control value converting unit 115 the power value (dB) that results from the addition. Control value converting unit 115 converts the power value (dB) provided from control-amount adding unit 112 to the control value (voltage value) that is provided to GCA 102. GCA 102 controls the transmission-power amplification gain of the transmission signal supplied from signal modulator 101 according to the control value (voltage value) from control value converting unit 115.

Every time detector 106 detects the transmission power, the transmission-power control operation is repeated via the feedback system as described above. The repeated one period is referred to here as one cycle (or, one step).

The mobile-communication equipment, according to this embodiment, has a feature that, in the process of repeated operation of the transmission-power control, as described above, loop-gain generating unit 110 selects and outputs one of the first and second loop-gain values according to the cyclic timing from timing unit 114. The first loop-gain value may be set as a small value such as "0.2", and the second loop-gain value may be set as a large value such as "1.0". These first and second loop-gain values are not limited to the cited values and can be changed to any appropriate value. Note, however, that, the condition that "the first loop-gain value">"the second loop-gain value" needs to be satisfied.

Figure 2:
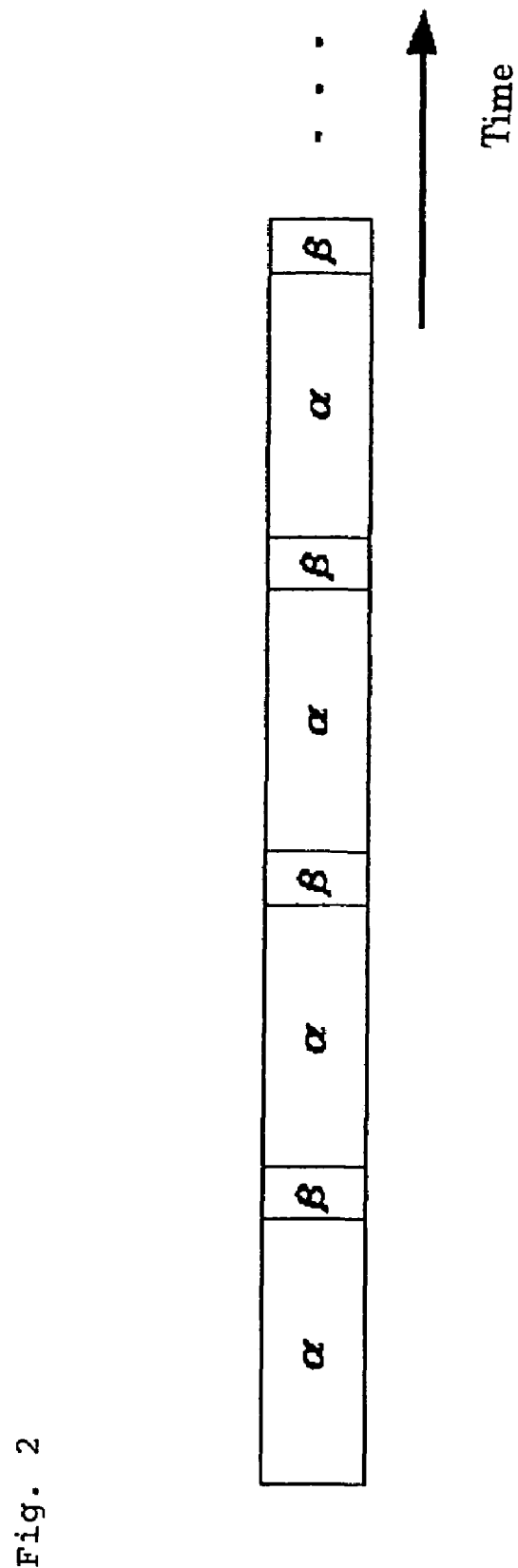
FIG. 2 is a schematic view of an example of a timing signal used in the mobile-communication equipment shown in FIG. 1.

Timing unit 114 provides cyclic timing such as shown in FIG. 2. This example alternately and periodically repeats the "α" interval where the first loop-gain value is selected and the "β" interval where the second loop-gain value is selected. The time ratio of the "α" interval to the "β" interval is 1:4, in which the "α" interval has a longer period than the "β" interval. The beginning of the first "α" interval corresponds to the point when the transmission-power control starts.

According to the timing shown in FIG. 2, loop-gain generating unit 110 selects the first loop-gain value of "0.2" during the "α" interval, and selects the second loop-gain value of "1.0" during the "β" interval. The first loop-gain value of "0.2" and the second loop-gain value of "1.0" are thus periodically switched at a time ratio of 4:1.

During the period in which the first loop-gain value of "0.2" is selected, feedback-amount generating unit 111 outputs a smaller feedback amount, so that GCA 102 can have a smaller variable amount of transmission-power amplification gain in the transmission signal. On the other hand, during the period in which the second loop-gain value of "1.0" is selected, feedback-amount generating unit 111 outputs a larger feedback amount, so that GCA 102 can have a larger variable amount of transmission-power amplification gain in the transmission signal, and thus it allows the transmission power of the transmission signal to reach to the transmission-power set value in a shorter time. In view of these advantages, this embodiment can have the following effects due to the cyclic switching of the loop-gain values.

As described above in the section of the problems to be solved by the invention, if the system continuously has a large loop-gain value such as "1.0", the transmission power does not converge and the feedback system may oscillate. According to this embodiment, since loop-gain generating unit 110 periodically switches the loop-gain value from "1.0" to "0.2", it provides a configuration that causes oscillation to be difficult.

Further, as described above, if the feedback system continuously has a small loop-gain value such as "0.2", a problem may occur such that it takes a longer time for the transmission power to reach the set value. An additional problem may occur in which the PA temperature characteristics may change the correlation between the detected voltage value and the power value (conversion value) in the conversion table, so that the transmission power reaches the value that includes a certain control error in the transmission-power set value. This provides lower control accuracy. This embodiment can periodically switch the loop-gain value from "0.2" to "1.0" so that the transmission power reaches the transmission-power set value in a shorter time and at a higher accuracy. This effect will be described specifically below with reference to the comparison examples between mobile-communication equipment in this embodiment and conventional equipment.

Figure 3:
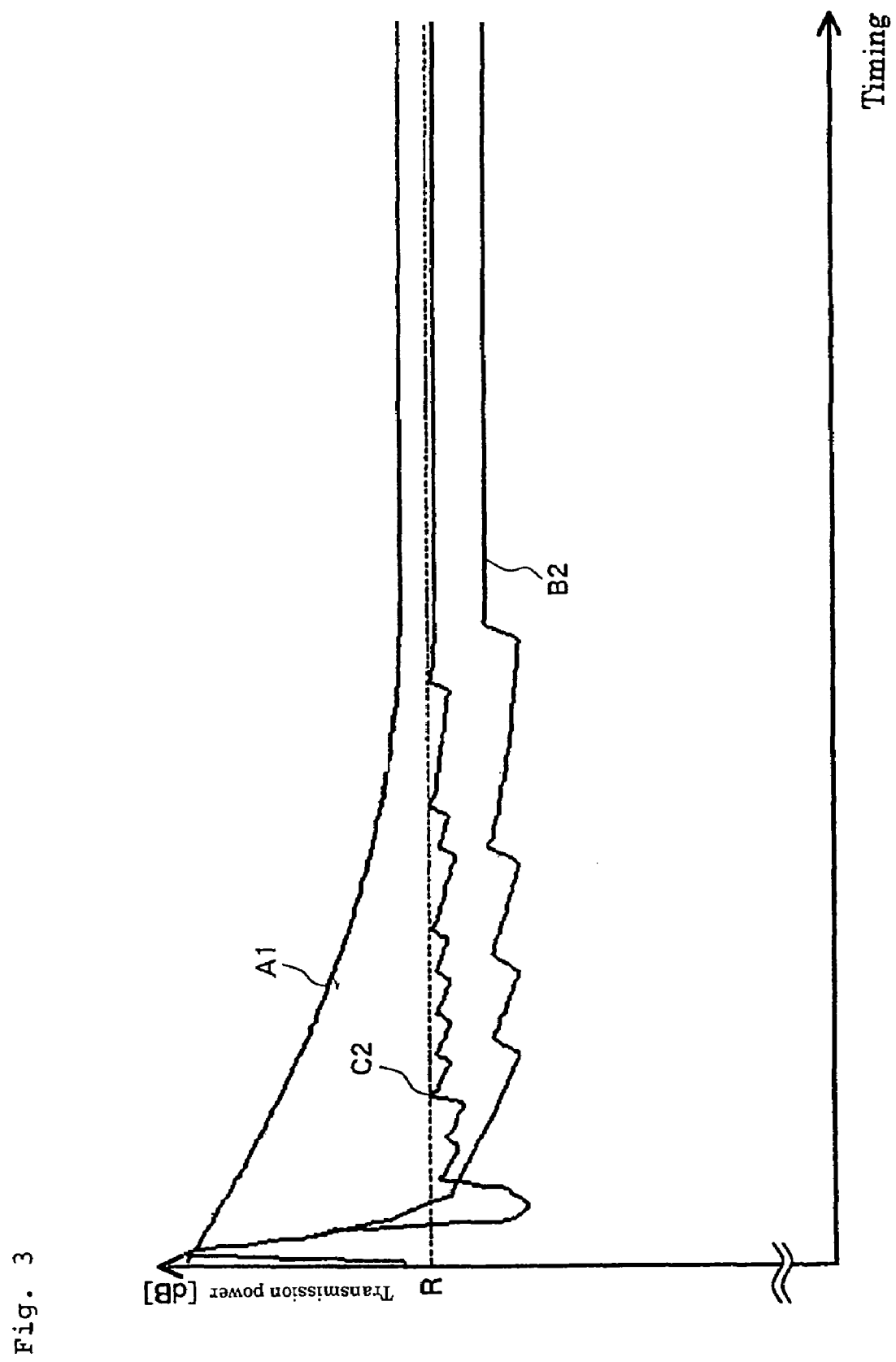
FIG. 3 is a schematic view that compares the transmission-power outputs of mobile-communication equipment shown in FIG. 1 with the outputs of the conventional equipment.
Figure 4:
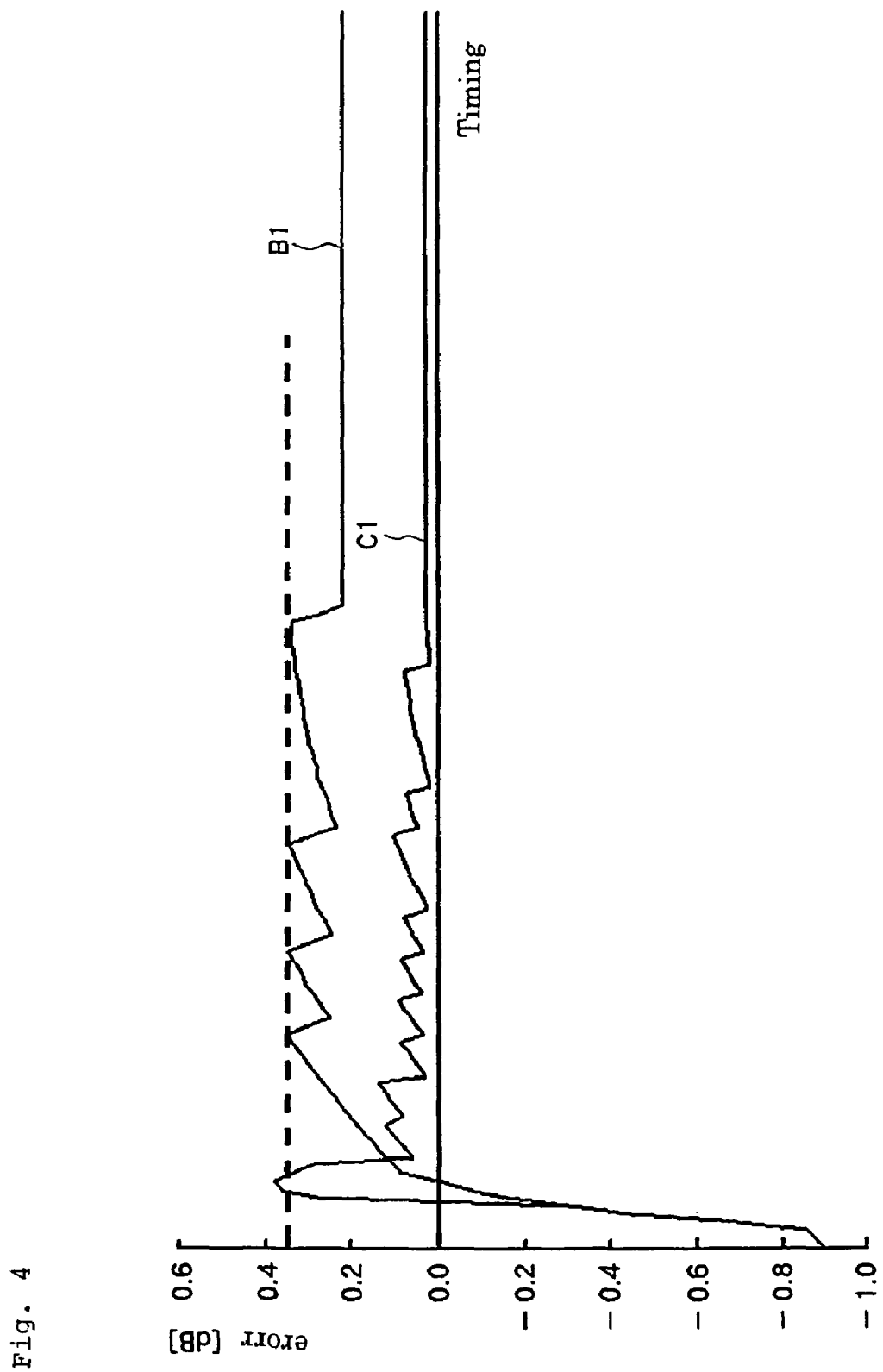
FIG. 4 is a schematic view that compares transmission-power error calculations of mobile-communication equipment shown in FIG. 1 with the transmission-power error calculations of conventional equipment.

FIG. 3 shows the comparison results for transmission-power output. FIG. 4 shows the comparison results for transmission-power error calculation. In FIG. 3, curve A1 is a transmission-power waveform without the APC function, which models the actual measurements of PA temperature characteristics (substantial PA temperature characteristics curve). Curve B2 is a transmission-power waveform with a conventional APC function, and curve C2 is a transmission-power waveform according to this embodiment. Curves B2 and C2 are both simulated. In FIG. 4, curve B1 shows the transition of the transmission-power error in curve B2, and curve C1 shows the transition of the transmission-power error in curve C2.

As can be seen from curve A1, transmission power (PA output) gradually decreases as the temperature increases. Transmission power (PA output) becomes constant when the temperature becomes constant after a certain time has passed. Note that the transmission power may be different from the transmission-power set value because of the effect of the outside-air temperature and the like, design error, non-linearity of dynamic range, and adjustment error before shipping and the like.

The error value may become zero, when the value that is obtained by subtracting the transmission power detected value R1 from the transmission-power set value R is below a certain value. Once the error value becomes zero, the error is not reflected and the transmission power reaches a value different from the transmission-power set R. More specifically, for the round-down error, for example, to be ⅓ dB, due to rounding by digital process, if the value of "R–R1" stays below ⅓ dB, the transmission power will not reach the transmission-power set R. The transmission-power control by the conventional APC (curve B2) may change the correlation between the detected voltage value and the power value in the conversion table during the period from the start of the transmission until the PA temperature is stable. The converted power value thus includes the error that is due to the PA temperature characteristics, and feedback control is performed in a condition that causes the combination of that error and the rounding error. Under this condition, the error value remains below or equal to a certain value, so that the transmission power reaches the transmission-power set value R in a condition that includes the control error. The transmission signal is thus transmitted with incorrect transmission power.

On the other hand, in the transmission-power control according to this embodiment (curve C2), even when the error value falls below or equals a certain value (for example ⅓ dB), the periodic switching of the loop-gain value from "0.2" to "1.0" forcibly increases the error value to generate the feedback amount, so that the error value does not remain below or equal to a certain value (for example ⅓ dB). The transmission power thus reaches a value near the transmission-power set value R, which provides higher control accuracy than that of the conventional equipment.

In addition, the transmission-power control according to this embodiment (curve C2) provides a shorter time for convergence than the conventional control. This is because the periodic switching of the loop-gain value to "1.0" generates the feedback amount which can provide the amplified PA input and can prevent the effects of the PA temperature characteristics to a certain degree, thereby ensuring the rounding error can be detected together the error due to the PA temperature characteristics. In this way, ensuring that the rounding error does not go undetected, can allow the transmission power to reach the transmission-power set value R, within the rounding error, thereby providing a shorter time for convergence than the conventional control.

Embodiment 2

Figure 5:
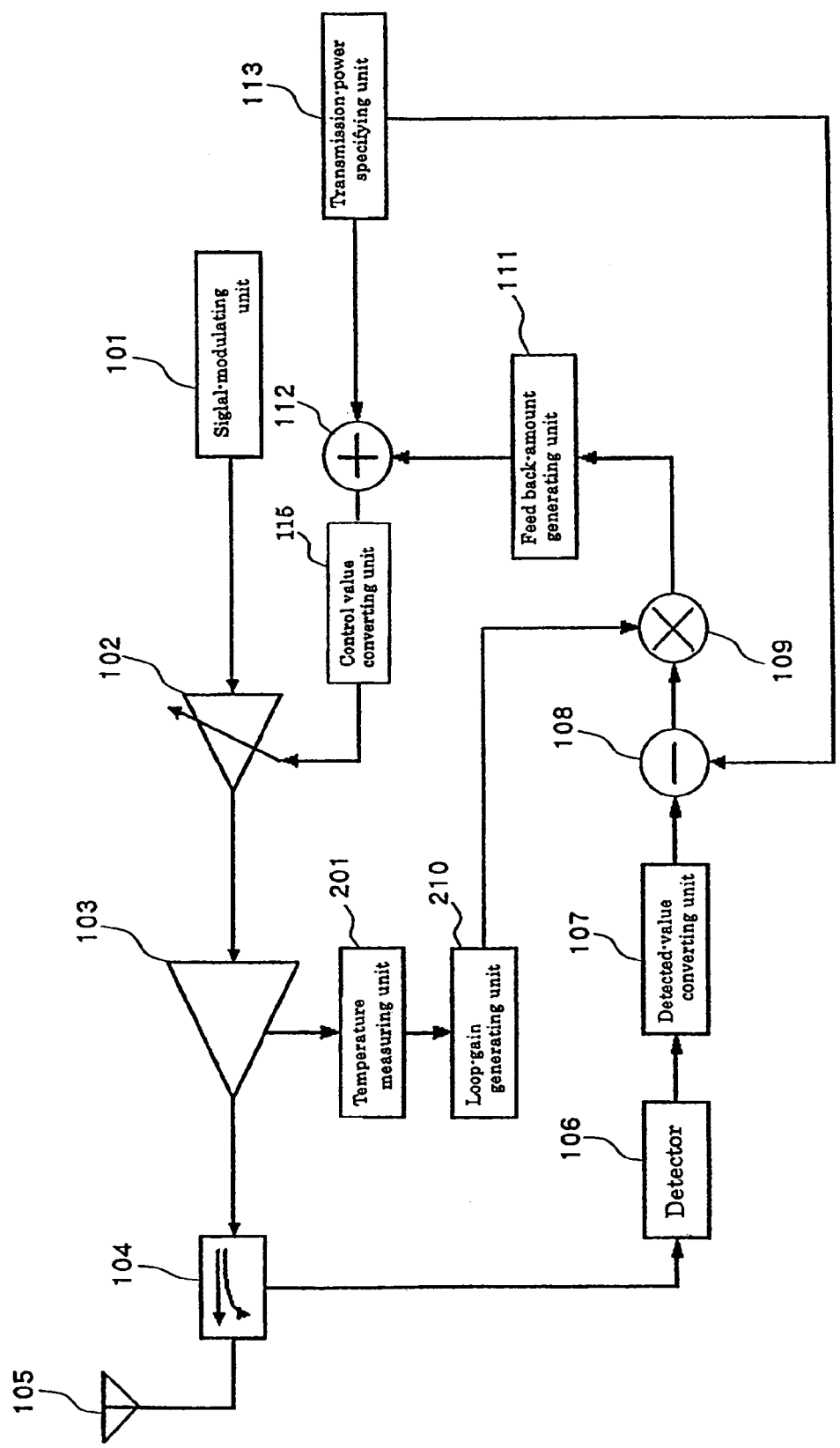
FIG. 5 is a block diagram of a schematic configuration of mobile-communication equipment according to the second embodiment of the present invention.

FIG. 5 is a block diagram of a schematic configuration of the mobile-communication equipment according to the second embodiment of the present invention. In the configuration of the transmission-power controlling unit shown in FIG. 1, this mobile-communication equipment replaces loop-gain generating unit 110 and timing unit 114 with loop-gain generating unit 210 and temperature measuring unit 201. In FIG. 5, the same components as shown in FIG. 1 are referred to by the same reference symbols.

Temperature measuring unit 201 includes a temperature sensor to measure in a constant cycle the temperature of the portion of the circuit on which PA 103 is provided as heat source. If the difference between the temperature value that is measured this time and the temperature value that was measured last time is equal to or more than a predetermined value, temperature measuring unit 201 determines the temperature change and outputs a timing signal. Loop-gain generating unit 210 receives the timing signal outputted from temperature measuring unit 201. The measurement of temperature measuring unit 201 may or may not be synchronized with detector 106. For convenience, temperature measuring unit 201 is here assumed to measure the temperature in the same cycle as that for detection by detector 106.

Loop-gain generating unit 210 has the first small loop-gain value such as "0.2" and the second large loop-gain value such as "1.0", and selectively switches these loop-gain values to output one of them. Loop-gain generating unit 210 switches the loop-gain values according to the timing signal provided by temperature measuring unit 201. More specifically, after receiving the timing signal from temperature measuring unit 201, loop-gain generating unit 210 determines that the temperature characteristics causes a difference between the detected value measured by detector 106 and the power value (conversion value) in the conversion table used in detected-value converting unit 107. Loop-gain generating unit 210 then outputs the second loop-gain value for a predetermined period. The predetermined period may be a period of one control step (one cycle) or a period (only in the range without oscillation occurring) which is equal to or more than two control steps (two cycles). For convenience, it is here assumed for the following description that the predetermined period is a period of one control step (one cycle). Except for the predetermined period, loop-gain generating unit 210 outputs the first loop-gain value.

As described in the above section of the problems to be solved by the invention in the description of the related art, shortly after the start of the transmission, the feedback system has a lower temperature so that the system tends to have higher transmission power due to the PA 103 temperature characteristics. Depending on the characteristics of the PA used, actual measurements have shown that the measurement difference (P1–P2) is about 0.6 dB to 0.4 dB between the transmission power P1 shortly after the start of the transmission and the transmission power P2 under stable temperature conditions after a certain time has passed. Such a difference may cause the transmission power, within the feedback system, to vary with temperature increases. In this embodiment, temperature measuring unit 201 which is mounted near PA 103 serving as the heat source detects the temperature, and according to the detected temperature, loop-gain generating unit 210 switches the loop-gain values as follows.

During the period from the start of the transmission until the temperature is stable, temperature measuring unit 201 outputs a timing signal every time a predetermined amount of temperature change is detected. Every time the timing signal is received, loop-gain generating unit 210 outputs the second loop-gain value such as "1.0" for a period of one control step (one cycle). During this period, therefore, feedback-amount generating unit 111 outputs a larger feedback amount, so that GCA 102 operates with a larger variable amount of transmission-power amplification gain in the transmission signal. The feedback system allows the transmission power of the transmission signal to reach the transmission-power set value in a shorter time. In addition, loop-gain generating unit 210 selects and outputs a large loop-gain value such as "1.0", thereby preventing the feedback amount from being mistakenly made into zero due to the combined effects of PA temperature characteristics and the rounding error, thereby providing correct feedback control. Furthermore, since the second large loop-gain value such as "1.0" is selected only during the period of one control step (one cycle), the feedback system dose not oscillate in the period thereof.

After the temperature is stable, temperature measuring unit 201 outputs no more timing signals, so that loop-gain generating unit 210 selects and outputs the first loop-gain value such as "0.2". This allows feedback-amount generating unit 111 to output a smaller feedback amount, so that GCA can operate with a smaller variable amount of transmission-power amplification gain of the transmission signal.

In the operation as described above, the second embodiment can provide the same operations and effects as in the above-mentioned first embodiment.

In the mobile-communication equipment according to the first and second embodiments as described above, appropriate modifications can be made to their configurations and operations without departing from the spirit and scope of the present invention.

The configurations according to the first and second embodiments may also be combined. For example, if the temperature of a predetermined portion is measured in a constant cycle and the difference between this-time-measured temperature value and the-last-time-measured temperature value is equal to or more than a predetermined value, then the second loop-gain value may be outputted for a predetermined period, and the first and second loop-gain values may be periodically switched and outputted at a predetermined time ratio except for the predetermined period. This configuration can provide a still shorter convergence time than in the first and second embodiments.

While preferred embodiments of the present invention have been described using specific terms, such description is for illustrative purposes only, and it is to be understood that changes and variations may be made without departing from the spirit or scope of the following claims.

The invention claimed is:

1. Mobile communication equipment comprising:
a power amplifier for amplifying a transmission signal; and
a feedback circuit for providing feedback to allow said power amplifier to output a transmission-power set value, wherein
said feedback circuit comprises:
a transmission-power specifying unit for specifying said transmission-power set value;
an error-detection unit for detecting an error between a power value obtained by detecting a portion of the power of the transmission signal amplified by said power amplifier and the transmission-power set value specified by said transmission-power specifying unit;
a loop-gain generating unit for periodically switching two different loop-gain values at a predetermined time ratio to output one of them;
a loop-gain multiplying unit for multiplying the error detected by said error-detection unit by the loop-gain value supplied from said loop-gain generating unit to output an error value that results from said multiplication; and
a feedback-amount generating unit for integrating the error value supplied from said loop-gain multiplying unit to generate a specific amount of said feedback.

2. Mobile communication equipment comprising:
a power amplifier for amplifying a transmission signal; and
a feedback circuit for providing feedback to allow said power amplifier to output a transmission-power set value, wherein
said feedback circuit comprises:
a transmission-power specifying unit for specifying said transmission-power set value;
an error-detection unit for detecting an error between a power value obtained by detecting a portion of the power of the transmission signal amplified by said power amplifier and the transmission-power set value specified by said transmission-power specifying unit;
a temperature measuring unit for measuring the temperature of a predetermined portion and outputting a timing signal upon detection of a certain amount of temperature change;
a loop-gain generating unit for holding a first loop-gain value and a second loop-gain value that is larger than said first loop-gain value, and upon receipt of said timing signal provided from said temperature measuring unit, outputting said second loop-gain value for a predetermined period, and outputting said first loop-gain value except for said predetermined period;

a loop-gain multiplying unit for multiplying the error detected by said error-detection unit by the loop-gain value supplied from said loop-gain generating unit, and outputting an error value as said multiplication results; and a feedback-amount generating unit for integrating the error value supplied from said loop-gain multiplying unit to generate a specific amount of said feedback.

3. Mobile-communication equipment according to claim 2, wherein said predetermined portion is a portion of the circuit of the mobile-communication equipment on which said power amplifier is provided.

4. Mobile communication equipment comprising:

a power amplifier for amplifying a transmission signal; and a feedback circuit for providing feedback to allow said power amplifier to output a transmission-power set value, wherein said feedback circuit comprises:

a transmission-power specifying unit for specifying said transmission-power set value;

an error-detection unit for detecting an error between a power value obtained by detecting a portion of the power of the transmission signal amplified by said power amplifier and the transmission-power set value specified by said transmission-power specifying unit;

a temperature measuring unit for measuring the temperature of a predetermined portion and outputting a timing signal upon detection of a given amount of temperature change;

a loop-gain generating unit for holding a first loop-gain value and a second loop-gain value that is larger than said first loop-gain value, and upon receipt of said timing signal provided from said temperature measuring unit, outputting said second loop-gain value for a predetermined period, and periodically switching said first and second loop-gain values at a predetermined time ratio to output one of them except for said predetermined period;

a loop-gain multiplying unit for multiplying the error detected by said error-detection unit by the loop-gain value outputted from said loop-gain generating unit, and outputting an error value that results from said multiplication; and a feedback-amount generating unit for integrating the error value supplied from said loop-gain multiplying unit to generate a specific amount of said feedback.

5. Mobile-communication equipment according to claim 4, wherein said predetermined portion is a portion of the circuit of the mobile-communication equipment on which said power amplifier is provided.

6. A transmission-power control method for providing feedback to allow a power amplifier to amplify a transmission signal to output a specified transmission-power set value, comprising:

a first step of detecting a portion of the power of the transmission signal amplified by said power amplifier to obtain a power value;

a second step of detecting an error between a power value obtained in said first step and said specified transmission-power set value;

a third step of periodically switching two different loop-gain values at a predetermined time ratio to output one of them; and a fourth step of multiplying the error detected in said second step by the loop-gain value outputted in said third step, and integrating an error value that results from said multiplication to generate a specific amount of said feedback.

7. A transmission-power control method for providing feedback to allow a power amplifier to amplify a transmission signal to output a specified transmission-power set value, comprising:

a first step of detecting a portion of the power of the transmission signal amplified by said power amplifier to obtain a power value;

a second step of detecting an error between a power value obtained in said first step and said specified transmission-power set value;

a third step of measuring the temperature of a predetermined portion and detecting a certain amount of temperature change;

a fourth step of holding a first loop-gain value and a second loop-gain value that is larger than said first loop-gain value, and upon detection of a certain amount of temperature change in said third step, outputting said second loop-gain value for a predetermined period, and outputting said first loop-gain value except for said predetermined period; and a fifth step of multiplying the error detected in said second step by the loop-gain value outputted in said fourth step, and integrating an error value that results from said multiplication to generate a specific amount of said feedback.

8. A transmission-power control method according to claim 7, wherein said predetermined portion is a portion of the circuit for performing said feedback on which said power amplifier is provided.

9. A transmission-power control method for providing feedback to allow a power amplifier to amplify a transmission signal to output a specified transmission-power set value, comprising:

a first step of detecting a portion of the power of the transmission signal amplified by said power amplifier to obtain a power value;

a second step of detecting an error between a power value obtained in said first step and said specified transmission-power set value;

a third step of measuring the temperature of a predetermined portion and detecting a certain amount of temperature change;

a fourth step of holding a first loop-gain value and a second loop-gain value that is larger than said first loop-gain value, and upon detection of a certain given amount of temperature change in said third step, outputting said second loop-gain value for a predetermined period, and periodically switching said first and second loop-gain values at a predetermined time ratio to output one of them except for said predetermined period; and a fifth step of multiplying the error detected in said second step by the loop-gain value outputted in said fourth step, and integrating an error value that results from said multiplication to generate a specific amount of said feedback.

10. A transmission-power control method according to claim 9, wherein the above-described predetermined portion is a portion of the circuit for performing said feedback on which the above-described power amplifier is provided.

* * * * *